(12) United States Patent
Tseng et al.

(10) Patent No.: US 11,722,058 B2
(45) Date of Patent: Aug. 8, 2023

(54) EMULATED CURRENT GENERATION CIRCUIT OF POWER CONVERTING CIRCUIT AND METHOD THEREOF

(71) Applicant: uPI semiconductor corp., Zhubei (TW)

(72) Inventors: Chao-Wei Tseng, Zhubei (TW); Yow-Tsyr Liang, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 117 days.

(21) Appl. No.: 17/227,435

(22) Filed: Apr. 12, 2021

(65) Prior Publication Data
US 2021/0328509 A1 Oct. 21, 2021

(30) Foreign Application Priority Data
Apr. 15, 2020 (CN) .......................... 202010293429.X

(51) Int. Cl.
*H02M 3/155* (2006.01)
*H03K 4/08* (2006.01)

(52) U.S. Cl.
CPC .............. *H02M 3/155* (2013.01); *H03K 4/08* (2013.01)

(58) Field of Classification Search
CPC ............ H02M 3/00; H02M 3/02; H02M 3/04; H02M 3/10; H02M 3/135; H02M 3/137; H02M 3/139; H02M 3/142; H02M 3/145; H02M 3/155; H02M 3/1552; H02M 3/156; H02M 3/1563; H02M 3/1566; H02M 3/157; H02M 3/158; H02M 3/1582; H02M 3/1588; H02M 1/0003; H02M 1/0009; H02M 1/0012; H02M 1/0025; H02M 1/08; H03K 4/00; H03K 4/06; H03K 4/08; H03K 4/12; H03K 4/48; H03K 4/50;
(Continued)

(56) References Cited

U.S. PATENT DOCUMENTS 6,930,474 B2    8/2005   Wang
9,184,651 B2   11/2015   Nguyen et al.
(Continued)

FOREIGN PATENT DOCUMENTS

TW    M588919 U    1/2020

*Primary Examiner* — Thienvu V Tran
*Assistant Examiner* — Carlos O Rivera-Perez
(74) *Attorney, Agent, or Firm* — McClure, Qualey & Rodack, LLP

(57) ABSTRACT

An emulated current generation circuit of a power converting circuit, providing an emulated current includes an AC component current and a DC component current, includes a first current circuit, a second current circuit, a combination circuit and a calibration circuit. The first current circuit generates a ramp signal as the AC component current. The second current circuit is coupled to an output stage of power converting circuit to provide a sensing current. The DC component current is generated after performing a sample-and-hold processing on the sensing current. The combination circuit is coupled to the first current circuit and second current circuit respectively to combine the AC component current and DC component current into an emulated sensing current. The calibration circuit is coupled to the first current circuit, second current circuit and combination circuit to dynamically adjust the ramp signal according to the emulated sensing current and sensing current.

10 Claims, 11 Drawing Sheets

(58) Field of Classification Search
CPC .......... H03K 4/501; H03K 4/502; H03K 4/56;
Y02B 70/10; G01R 19/25; G01R 19/257;
G01R 1/20
USPC ........ 323/222–226, 271–280, 282–288, 351;
327/131–140
See application file for complete search history.

(56) References Cited

U.S. PATENT DOCUMENTS

| | | |
|---|---|---|
| 9,812,963 B1 | 11/2017 | Nguyen et al. |
| 9,853,548 B1 | 12/2017 | Zhang |
| 10,044,267 B1 | 8/2018 | Childs |
| 10,063,146 B1 | 8/2018 | Lee |
| 2014/0268950 A1* | 9/2014 | Medina-Garcia ............................ H02M 3/33523 363/78 |
| 2021/0006159 A1 | 1/2021 | Ke |
| 2021/0099080 A1* | 4/2021 | Chen .................... H02M 3/155 |

* cited by examiner

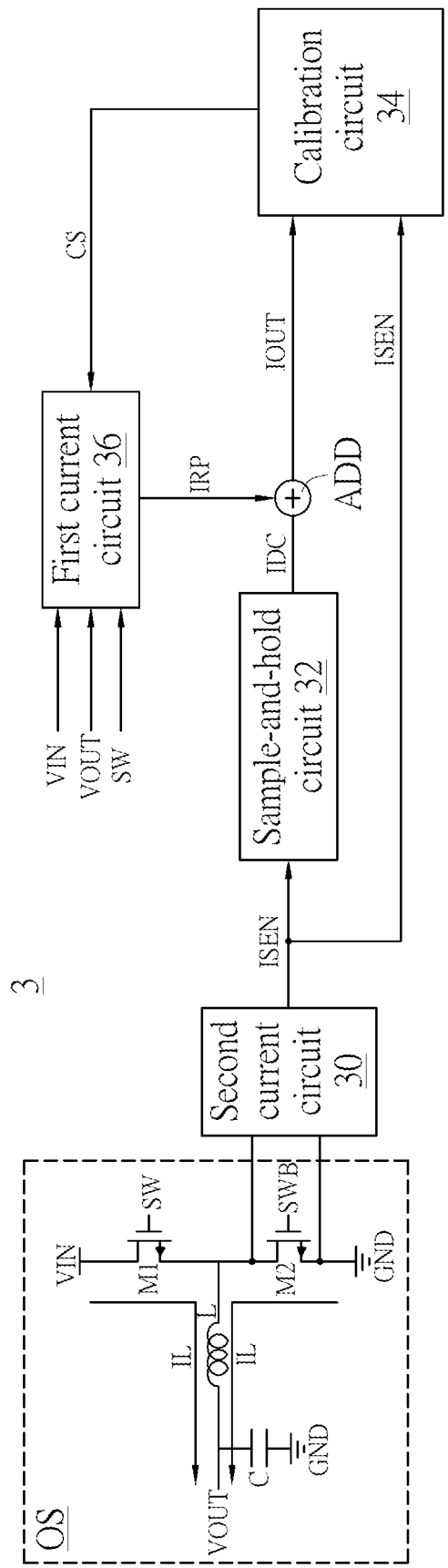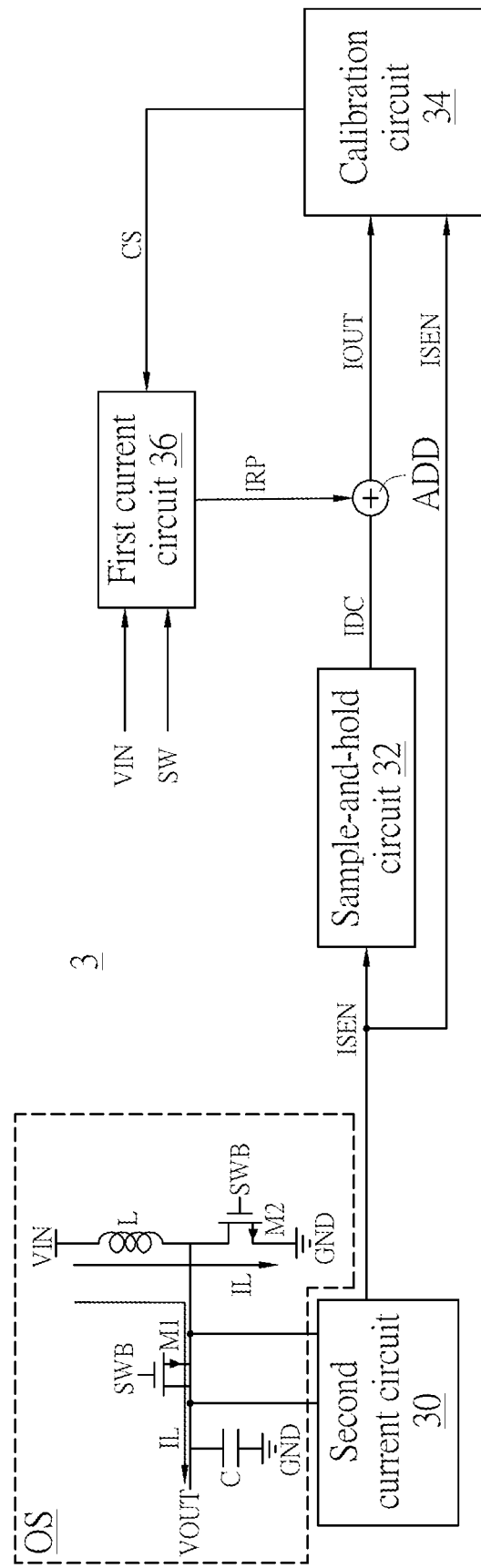
FIG. 3A
FIG. 3B

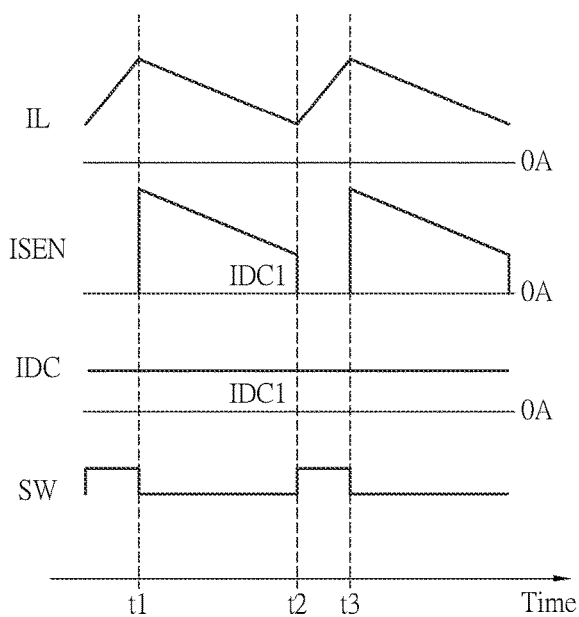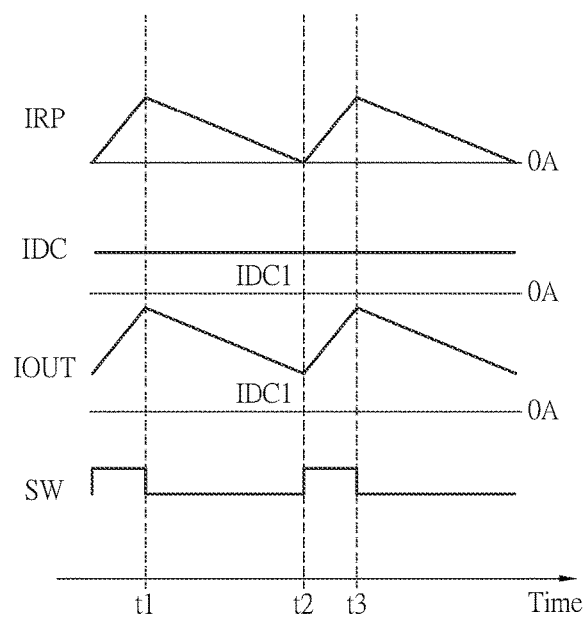
FIG. 4A
FIG. 4B

EMULATED CURRENT GENERATION CIRCUIT OF POWER CONVERTING CIRCUIT AND METHOD THEREOF

BACKGROUND OF THE INVENTION

1. Field of the Invention

The invention relates to a power converting circuit; in particular, to an emulated current generation circuit of a power converting circuit and a method thereof.

2. Description of the Prior Art

In the field of buck or boost power converting circuits, with the increasing of the system operating frequency, the on-time of the switch of the output stage of the power converting circuit is very short under a condition of switching the switch at high speed, so the conventional current sensing circuit fails to sense the waveform of the inductor current immediately.

In order to improve the above-mentioned deficiencies, there is an existing method to obtain the sensing current through a sample-and-hold method. The problem with this method is that the sensing current waveform is not instantaneous; another existing method is to combine a partial emulated current and a partial sensing current into a complete current waveform. The disadvantages with this method are high circuit cost and high control difficulty. Therefore, the above-mentioned problems encountered in the prior arts still need to be solved urgently.

SUMMARY OF THE INVENTION

Therefore, the invention provides an emulated current generation circuit of a power converting circuit and a method thereof to effectively solve the above-mentioned problems in the prior art.

An embodiment of the invention is an emulated current generation circuit of a power converting circuit. In this embodiment, the emulated current generation circuit provides an emulated sensing current including an AC component current and a DC component current. The emulated current generation circuit includes a first current circuit, a second current circuit, a combination circuit and a calibration circuit. The first current circuit is configured to generate a ramp signal as the AC component current. The second current circuit is coupled to an output stage of the power converting circuit and configured to provide a sensing current. The DC component current is generated after a sample-and-hold processing is performed on the sensing current. The combination circuit is coupled to the first current circuit and the second current circuit respectively and configured to combine the AC component current and the DC component current into the emulated sensing current. The calibration circuit is coupled to the first current circuit, the second current circuit and the combination circuit respectively and configured to dynamically adjust the ramp signal according to the emulated sensing current and the sensing current.

In an embodiment of the invention, the output stage is coupled to an inductor, and the sensing current is related to an inductor current flowing through the inductor.

In an embodiment of the invention, the first current circuit is coupled a setting resistor. The first current circuit generates the ramp signal using the setting resistor. A resistance of the setting resistor is related to an inductance of the inductor.

In an embodiment of the invention, the emulated current generation circuit further includes at least one sample-and-hold circuit coupled between the second current circuit and the combination circuit to perform the sample-and-hold processing on the sensing current to generate the DC component current.

In an embodiment of the invention, the calibration circuit includes a subtraction circuit configured to receive the emulated sensing current and the sensing current to generate a difference signal, and the calibration circuit generates a calibration signal to the first current circuit according to the difference signal.

In an embodiment of the invention, the calibration circuit includes a first subtraction circuit, a first sampling circuit, a second sampling circuit and a second subtraction circuit. The first subtraction circuit receives the emulated sensing current and the sensing current. The first sampling circuit obtains a first difference value at a first time and the second sampling circuit obtains a second difference value at a second time, thereby generating a difference signal. The calibration circuit generates a calibration signal to the first current circuit according to the difference signal.

In an embodiment of the invention, the calibration circuit further includes an integral circuit and a comparing circuit; the integral circuit is configured to receive the difference signal to generate a difference voltage and the comparing circuit is configured to generate the calibration signal according to the difference voltage.

Another embodiment of the invention is an emulated current generation method. In this embodiment, the emulated current generation method provides an emulated sensing current including an AC component current and a DC component current. The emulated current generation method includes: (a) providing a ramp signal as the AC component current; (b) performing a sample-and-hold processing on a sensing current to generate the DC component current; (c) combining the AC component current and the DC component current into the emulated sensing current; and (d) dynamically adjusting the ramp signal according to the emulated sensing current and the sensing current.

In an embodiment of the invention, the sensing current is related to an inductor current flowing through an inductor.

In an embodiment of the invention, the method further includes: generating the ramp signal according to an output inductance information set by an external setting resistor.

In an embodiment of the invention, the step (d) further includes: adjusting a slope of the ramp signal.

In an embodiment of the invention, the step (d) further includes: integrating a difference between the emulated sensing current and the sensing current to adjust the ramp signal.

In an embodiment of the invention, the step (d) further includes: (d1) obtaining a difference between the emulated sensing current and the sensing current; and (d2) integrating the difference from the first time to the second time to adjust the ramp signal.

In an embodiment of the invention, the step (b) includes (b1) obtaining the sensing current; and (b2) performing at least one sample-and-hold processing on a valley value of the sensing current at a second time according to a pulse-width modulation (PWM) signal to obtain the DC component current.

Compared to the prior art, the emulated current generation circuit and the emulated current generation method of the power converting circuit of the invention set the AC component current (that is, emulating a waveform of the sensing current), determine the DC component current (that is, emulating a valley value of the sensing current) according to the minimum value of the sensing current, and then combine the two into an emulated sensing current. Since the emulated current generation circuit and the emulated current generation method of the invention predict the change of the actual inductor current through a full emulation method, it can effectively overcome the problems of the prior art incapability of real-time sensing current waveform, high circuit cost and high control difficulty, and the AC component current (that is, emulating a waveform of the sensing current) can be instantly corrected by the calibration circuit to improve the accuracy of the sensing current.

The advantage and spirit of the invention may be understood by the following detailed descriptions together with the appended drawings.

BRIEF DESCRIPTION OF THE APPENDED DRAWINGS

FIG. 3A illustrates a schematic diagram of the emulated current generation circuit of the invention applied to the buck power converter.

FIG. 3B illustrates a schematic diagram of the emulated current generation circuit of the invention applied to the boost power converter.

FIG. 4A illustrates a waveform timing diagram of the DC component current obtained through the sample-and-hold circuit.

FIG. 4B illustrates a waveform timing diagram of combining the AC component current and the DC component current into the emulated sensing current through the combination circuit.

DETAILED DESCRIPTION OF THE INVENTION

Figure 1:
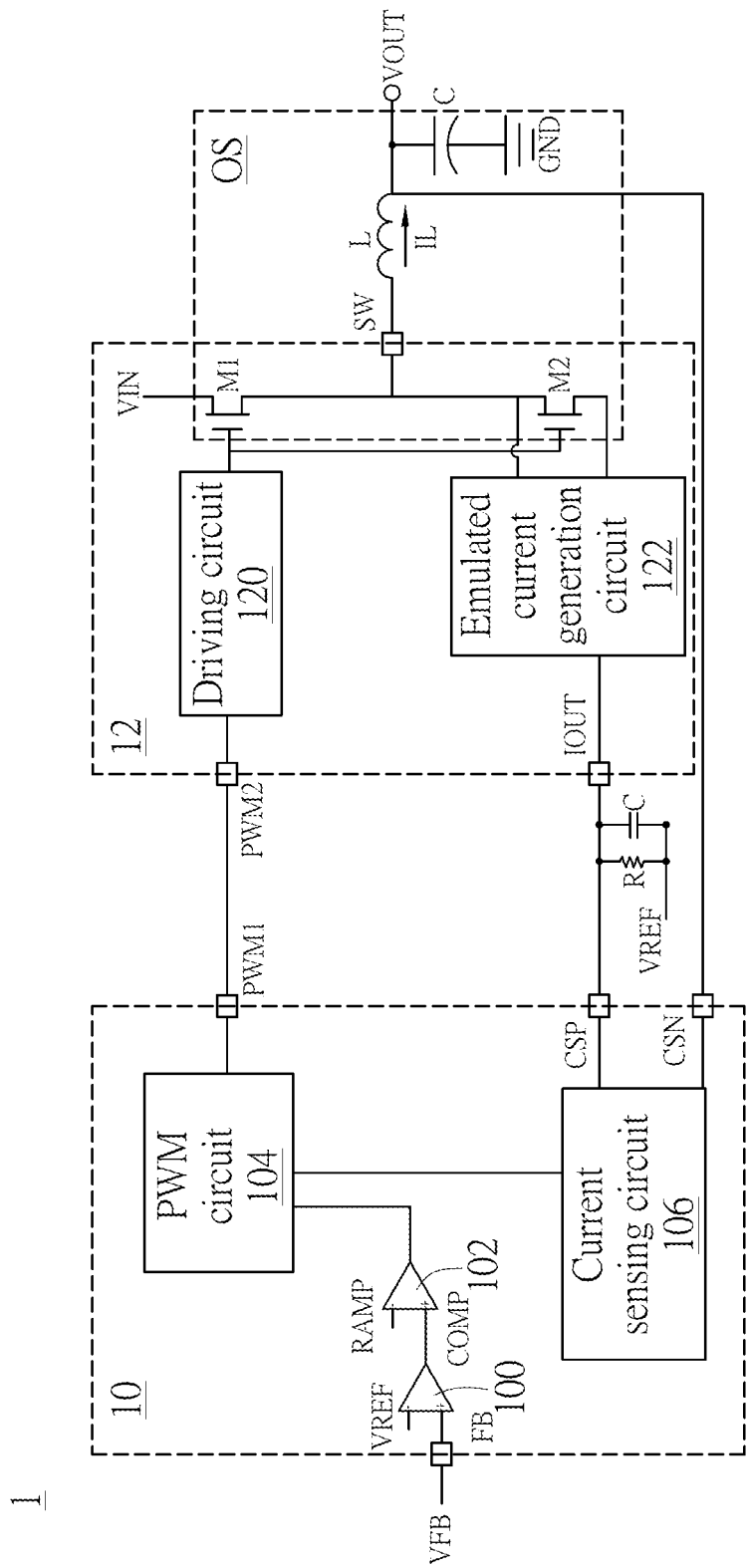
FIG. 1 illustrates a schematic diagram of the power converting circuit of the invention.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

A specific embodiment of the invention is an emulated current generation circuit. In this embodiment, the emulated current generation circuit can be applied to a switching power converting circuit (such as a buck power converting circuit or a boost power converting circuit) to provide the emulated sensing current in a fully emulation method, but not limited to this.

Please refer to FIG. 1. FIG. 1 illustrates a schematic diagram of the power converting circuit 1. As shown in FIG. 1, the power converting circuit 1 includes a control circuit 10, an integrated driver (DrMOS) 12, an inductor L and a capacitor C. The integrated driver 12 is coupled to the control circuit 10. One terminal of the inductor L is coupled to the integrated driver 12. The control circuit 10 is coupled to the other terminal of the inductor L. One terminal of the capacitor C is coupled to the other terminal of the inductor L and the other terminal of the capacitor C is coupled to the ground GND.

The control circuit 10 includes an error amplifier 100, a comparing circuit 102, a pulse-width modulation (PWM) circuit 104, a current sensing circuit 106, a first pin FB, a second pin PWM1, a third pin CSP and a fourth pin CSN.

The input terminal + of the error amplifier 100 is coupled to the first pin FB. The input terminal − of the error amplifier 100 receives a reference voltage VREF. The error amplifier 100 is configured to generate an error amplification signal COMP according to the reference voltage VREF and a feedback voltage VFB of the first pin FB.

The input terminal + of the comparing circuit 102 is coupled to the output terminal of the error amplifier 100 and the input terminal − of the comparing circuit 102 receives a ramp signal RAMP. The comparing circuit 102 is configured to compare the error amplification signal COMP with the ramp signal RAMP to generate a comparison result.

The PWM circuit 104 is coupled to the output terminal of the comparing circuit 102, the current sensing circuit 106 and the second pin PWM1 respectively and configured to generate a PWM signal according to the comparison result of the error amplification signal COMP and the ramp signal RAMP and the PWM signal is outputted through the second pin PWM1. The current sensing circuit 106 is coupled to the PWM circuit 104, the third pin CSP and the fourth pin CSN respectively and configured to provide a sensing current and the sensing current is outputted through the third pin CSP and the fourth pin CSN.

The integrated driver 12 includes a driving circuit 120, an emulated current generation circuit 122, a first switch M1, a second switch M2, a fifth pin PWM2, a sixth pin IOUT and a seventh pin SW. The fifth pin PWM2 is coupled to the second pin PWM1 of the control circuit 10. The driving circuit 120 is respectively coupled to the fifth pin PWM2, the control terminal of the first switch M1 and the control terminal of the second switch M2. The sixth pin IOUT is coupled to the third pin CSP of the control circuit 10. One terminal of the resistor R and one terminal of the capacitor C are both coupled between the third pin CSP and the sixth pin IOUT, and the other terminal of the resistor R and the other terminal of the capacitor C are both coupled to the reference voltage VREF. The first switch M1 is coupled between the input voltage VIN and the second switch M2 and the control terminal of the first switch M1 is coupled to the driving circuit 120. The second switch M2 is coupled between the first switch M1 and the emulated current generation circuit 122 and the control terminal of the second switch M2 is coupled to the driving circuit 120. The emulated current generation circuit 122 is coupled to the sixth pin IOUT and two terminals of the second switch M2 respectively.

One terminal of the inductor L is coupled between the first switch M1 and the second switch M2 through the seventh pin SW, and the other terminal of the inductor L is coupled to the output voltage VOUT. An inductor current IL flowing through the inductor L comes from between the first switch M1 and the second switch M2. The capacitor C is coupled between the output voltage VOUT and the ground terminal GND. In this embodiment, the output stage OS of the power converting circuit 1 includes a first switch M1, a second switch M2, an inductor L and a capacitor C, but not limited to this.

Figure 2:
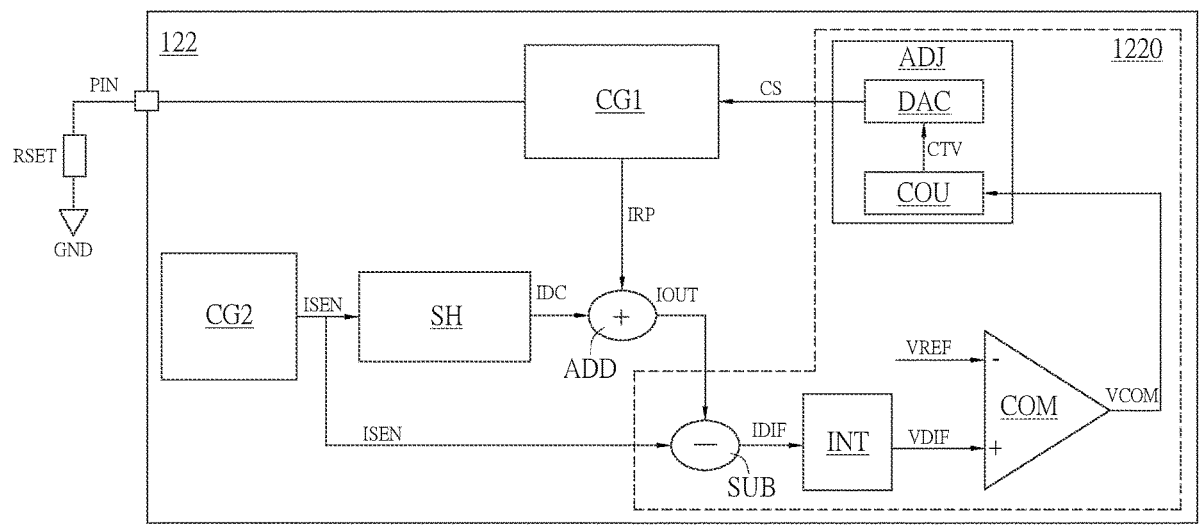
FIG. 2 illustrates a timing diagram of the emulated current generation circuit of the power converting circuit of the invention.

Please refer to FIG. 2. FIG. 2 illustrates a schematic diagram of the emulated current generation circuit 122 in the power converting circuit 1.

As shown in FIG. 2, the emulated current generation circuit 122 includes a first current circuit CG1, a second current circuit CG2, a sample-and-hold circuit SH, a combination circuit ADD and a calibration circuit 1220, and further includes an optional setting resistance pin PIN.

The setting resistor pin PIN is coupled to one terminal of an external setting resistor RSET and the other terminal of the setting resistor RSET is coupled to the ground terminal GND. The first current circuit CG1 is coupled to the setting resistance pin PIN, the combination circuit ADD and the calibration circuit 1220 respectively. The second current circuit CG2 is coupled to the sample-and-hold circuit SH, the calibration circuit 1220 and two terminals of the external second switch M2 (not shown in FIG. 2) respectively. The sample-and-hold circuit SH is coupled between the second current circuit CG2 and the combination circuit ADD. The combination circuit ADD is coupled to the first current circuit CG1, the sample-and-hold circuit SH and the calibration circuit 1220 respectively. The calibration circuit 1220 is respectively coupled to the second current circuit CG2, the combination circuit ADD and the first current circuit CG1.

It should be noted that the first current circuit CG1 is coupled to the setting resistor RSET through the setting resistor pin PIN, and a resistance of the setting resistor RSET is related to an inductance of the inductor L, so that the first current initial waveform generated by the first current circuit CG1 is closer to the real current waveform, but not limited to this.

The first current circuit CG1 generates a ramp signal as an AC component current IRP and provides it to the combination circuit ADD. The second current circuit CG2 is coupled to the output stage OS of the power converting circuit 1 to provide the sensing current ISEN to the sample-and-hold circuit SH and the calibration circuit 1220 respectively. In practical applications, the sensing current ISEN is related to the inductor current IL flowing through the inductor L in the output stage OS, but not limited to this.

When the sample-and-hold circuit SH receives the sensing current ISEN, the sample-and-hold circuit SH performs the sample-and-hold processing on the sensing current ISEN and then generates a DC component current IDC to the combination circuit ADD. In practical applications, the DC component current IDC is a fixed current value and is the minimum value (valley) of the sensing current ISEN/the inductor current IL, but not limited to this.

When the combination circuit ADD receives the AC component current IRP from the first current circuit CG1 and the DC component current IDC from the sample-and-hold circuit SH, the combination circuit ADD will combine the AC component current IRP and the DC component current IDC into the emulated sensing current IOUT and output the emulated sensing current IOUT to the calibration circuit 1220.

When the calibration circuit 1220 receives the sensing current ISEN from the second current circuit CG2 and the emulated sensing current IOUT from the combination circuit ADD, the calibration circuit 1220 will generate a calibration signal CS to the first current circuit CG1 according to the sensing current ISEN and the emulated sensing current IOUT to dynamically adjust the slope of the ramp signal (that is, the AC component current IRP provided to the combination circuit ADD) generated by the first current circuit CG1, so that the emulated sensing current IOUT is m times the inductor current IL, and m is a sensing current scaling ratio.

In one embodiment, as shown in FIG. 2, the calibration circuit 1220 includes a subtraction circuit SUB, an integration circuit INT, a comparing circuit COM and an adjusting circuit ADJ. The subtraction circuit SUB is coupled to the second current circuit CG2, the combination circuit ADD and the integration circuit INT respectively. The integration circuit INT is coupled between the subtraction circuit SUB and the input terminal + of the comparing circuit COM. The input terminal − of the comparing circuit COM receives the reference voltage VREF. The output terminal of the comparing circuit COM is coupled to the adjusting circuit ADJ. The adjusting circuit ADJ is coupled to the first current circuit CG1.

When the subtraction circuit SUB receives the sensing current ISEN from the second current circuit CG2 and the emulated sensing current IOUT from the combination circuit ADD, the subtraction circuit SUB subtracts the emulated sensing current IOUT and the sensing current ISEN to generate a difference signal IDIF to the integration circuit INT.

When the integration circuit INT receives the difference signal IDIF, the integration circuit INT will integrate the difference signal IDIF from a first time to a second time to generate the difference voltage VDIF to the input terminal + of the comparing circuit COM.

When the input terminal+ and input terminal − of the comparing circuit COM receive the difference voltage VDIF and the reference voltage VREF respectively, the comparing circuit COM will compare the difference voltage VDIF with the reference voltage VREF and outputs their comparison result VCOM to the adjusting circuit ADJ. The adjusting circuit ADJ generates a calibration signal CS to the first current circuit CG1 according to the comparison result VCOM to dynamically adjust the slope of the ramp signal (that is, the AC component current IRP provided to the combination circuit ADD) generated by the first current circuit CG1, so that the emulated sensing current IOUT is m times the inductor current IL, and m is a sensing current scaling ratio.

In one embodiment, the adjusting circuit ADJ includes a counter COU and a digital-to-analog circuit DAC. The counter COU is coupled to the output terminal of the comparing circuit COM and the digital-to-analog circuit DAC. The digital-to-analog circuit DAC is coupled to the counter COU and the first current circuit CG1.

When the counter COU receives the comparison result VCOM between the difference voltage VDIF and the reference voltage VREF provided by the comparing circuit COM, if the comparison result VCOM indicates that the difference voltage VDIF is greater than the reference voltage VREF, it means that the emulated sensing current IOUT is too large, and the count value CTV provided by the counter COU will decrease by 1. If the comparison result VCOM indicates that the difference voltage VDIF is less than or equal to the reference voltage VREF, it means that the emulated sensing current IOUT is too small, and the count value CTV provided by the counter COU will increase by 1. In fact, the reference voltage VREF can be zero, but not limited to this.

Next, the digital-to-analog circuit DAC transmits the calibration signal CS to the first current circuit CG1 according to the count value CTV of the counter COU to dynamically adjust the slope of the ramp signal (that is, the AC component current IRP provided to the combination circuit ADD) generated by the first current circuit CG1 by adjusting the variable current source in the first current circuit CG1.

In practical applications, the emulated current generation circuit of the invention can be applied to various switching DC-DC power converters, such as buck power converting circuits or boost power converting circuits, but not limited to this. In addition, the emulated current generation circuit of the invention selects a switch with a relatively long on-time in the output stage for current sensing, but not limited to this.

Taking a buck power converter for example, please refer to FIG. 3A, the output stage OS of the buck power converter includes a first switch M1, a second switch M2, an inductor L and a capacitor C. The first switch M1 and the second switch M2 are coupled in series between the input voltage VIN and the ground terminal GND, and the control terminals of the first switch M1 and the second switch M2 are controlled by the switch control signals SW and SWB inverted from each other respectively. One terminal of the inductor L is coupled between the first switch M1 and the second switch M2 and the other terminal of the inductor L is coupled to the output voltage VOUT. The capacitor C is coupled between the output voltage VOUT and the ground terminal GND.

The emulated current generation circuit 3 includes a second current circuit 30, a sample-and-hold circuit 32, a calibration circuit 34, a combination circuit ADD and a first current circuit 36. The sample-and-hold circuit 32 is coupled between the second current circuit 30 and the combination circuit ADD. The combination circuit ADD is coupled to the sample-and-hold circuit 32, the first current circuit 36 and the calibration circuit 34 respectively. The calibration circuit 34 is coupled to the second current circuit 30, the combination circuit ADD and the first current circuit 36 respectively. The first current circuit 36 is coupled to the combination circuit ADD and the calibration circuit 34 respectively.

It should be noted that for the buck power converter, in the application of high transformer ratio, the on-time of the low-side switch (that is, the second switch M2) in its output stage is relatively long. Therefore, the second current circuit 30 selects the second switch M2 with the longer on-time and is coupled to both terminals of the second switch M2 for current sensing to provide the sensing current ISEN related to the inductor current IL flowing through the inductor L to the sample-and-hold circuit 32 and the calibration circuit 34.

The first current circuit 36 receives the input voltage VIN, the output voltage VOUT and the switch control signal SW of the first switch M1 respectively and generates a ramp signal accordingly as the AC component current IRP to provide to the combination circuit ADD.

When the sample-and-hold circuit 32 receives the sensing current ISEN related to the inductor current IL, the sample-and-hold circuit 32 will perform a sample-and-hold processing on the sensing current ISEN and generate a DC component current IDC to the combination circuit ADD.

For example, as shown in FIG. 4A and FIG. 4B, at the time t1, the switch control signal SW controlling the first switch M1 changes from high-level to low-level; that is, the first switch M1 is not turned on and the second switch M2 is turned on. Therefore, the second current circuit 30 coupled to both terminals of the second switch M2 starts to provide the sensing current ISEN, and the sensing current ISEN, like the inductor current IL, will decrease from a higher current value until the time t2.

At the time t2, the switch control signal SW changes from low-level to high-level again; that is, the first switch M1 is turned on and the second switch M2 is not turned on. Therefore, the second current circuit 30 coupled to both terminals of the second switch M2 stops providing the sensing current ISEN, and the current value IDC1 of the sensing current ISEN at the time t2 is the minimum value (valley value) of the sensing current ISEN/the inductor current IL, and the DC component current IDC can be obtained according to the current value IDC1.

When the combination circuit ADD receives the AC component current IRP from the first current circuit 36 and the DC component current IDC from the sample-and-hold circuit 32, the combination circuit ADD will combine the AC component current IRP and the DC component current IDC into the emulated sensing current IOUT and output it to the calibration circuit 34. For example, the combination circuit ADD can be an addition circuit or a circuit node for adding the AC component current IRP and the DC component current IDC to obtain the emulated sensing current IOUT.

When the calibration circuit 34 receives the sense current ISEN from the second current circuit 30 and the emulated sense current IOUT from the combination circuit ADD, the calibration circuit 34 generates a calibration signal CS to the first current circuit 36 according to the sense current ISEN and the emulated sense current IOUT to dynamically adjust the slope of the ramp signal (that is, the AC component current IRP provided to the combination circuit ADD) generated by the first current circuit 36, so that the emulated sensing current IOUT is m times the inductor current IL, m is the sensing current scaling ratio.

Taking a boost power converting circuit for example, please refer to FIG. 3B, the output stage OS includes a first switch M1, a second switch M2, an inductor L and a capacitor C. The first switch M1 and the second switch M2 are coupled in series between the output voltage VOUT and the ground terminal GND, and the control terminals of the first switch M1 and the second switch M2 are controlled by the switch control signals SWB and SW inverted from each other respectively. One terminal of the inductor L is coupled between the first switch M1 and the second switch M2 and the other terminal of the inductor L is coupled to the input voltage VIN. The capacitor C is coupled between the output voltage VOUT and the ground terminal GND.

The emulated current generation circuit 3 includes a second current circuit 30, a sample-and-hold circuit 32, a calibration circuit 34, a combination circuit ADD and a first current circuit 36. The sample-and-hold circuit 32 is coupled between the second current circuit 30 and the combination circuit ADD. The combination circuit ADD is coupled to the sample-and-hold circuit 32, the first current circuit 36 and the calibration circuit 34 respectively. The calibration circuit 34 is coupled to the second current circuit 30, the combination circuit ADD and the first current circuit 36 respectively. The first current circuit 36 is coupled to the combination circuit ADD and the calibration circuit 34 respectively.

For the boost power converting circuit, in the application of high transformer ratio, the on-time of the high-side switch (that is, the first switch M1) in the output stage OS is relatively long. Therefore, the second current circuit 30 selects the first switch M1 with a longer conduction time and is coupled to both terminals of the first switch M1 for current sensing to provide the sensing current ISEN related to the inductor current IL flowing through the inductor L to the sample-and-hold circuit 32 and the calibration circuit 34.

The method of generating the emulated sensing current IOUT of the boost power converting circuit is similar to that of the buck power converting circuit, so it will not be repeated here.

Figure 5A:
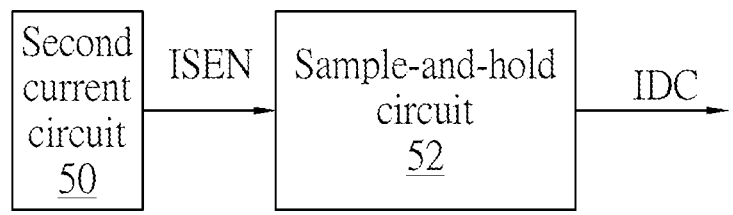
FIG. 5A and FIG. 5B illustrate a schematic diagram and a waveform timing diagram of the poor accuracy of the DC component current generated when the emulated current generation circuit samples through a single sample-and-hold circuit respectively.
Figure 5B:
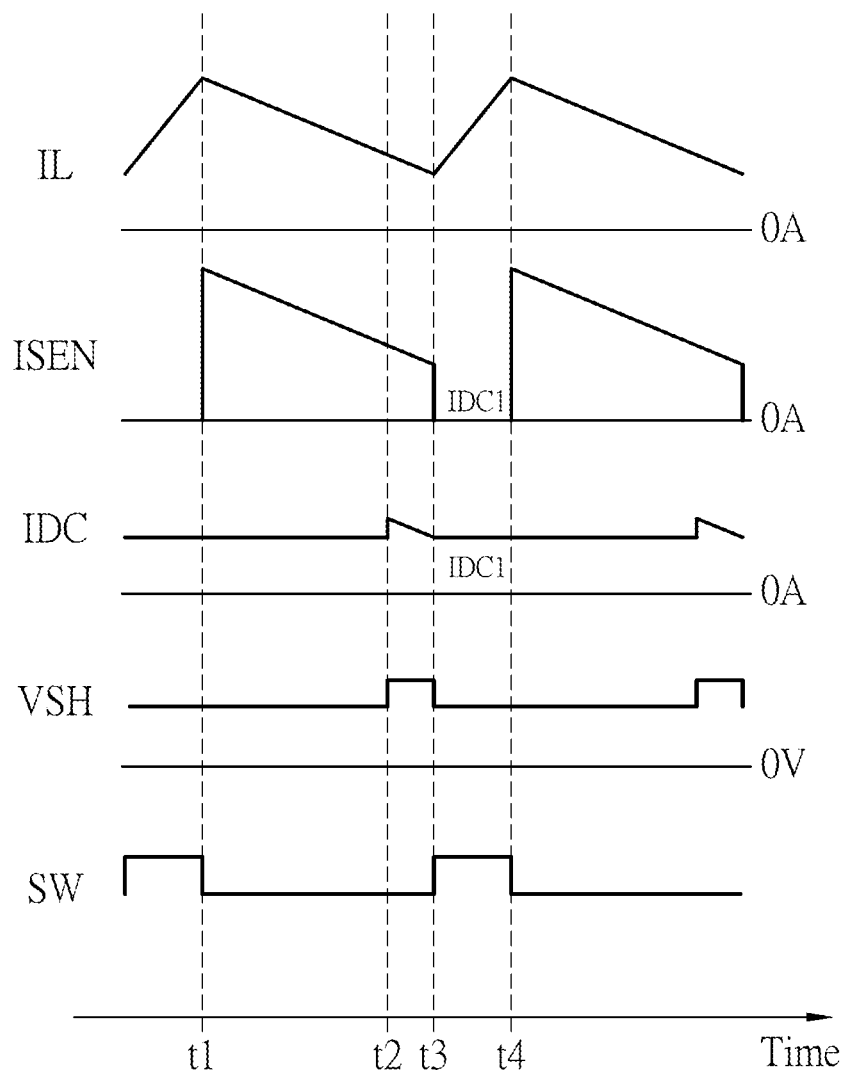

Next, please refer to FIG. 5A and FIG. 5B, if the emulated current generation circuit only uses one sample-and-hold circuit 52, during the sampling period of the sample-and-hold circuit 52 (for example, from the time t2 to the time t3 in FIG. 5B, the sampling signal VSH is HIGH), the DC component current IDC generated by the sample-and-hold circuit 52 has the same waveform with the sensing current ISEN and fails to maintain at a fixed current value IDC1, resulting in poor accuracy.

Figure 6A:
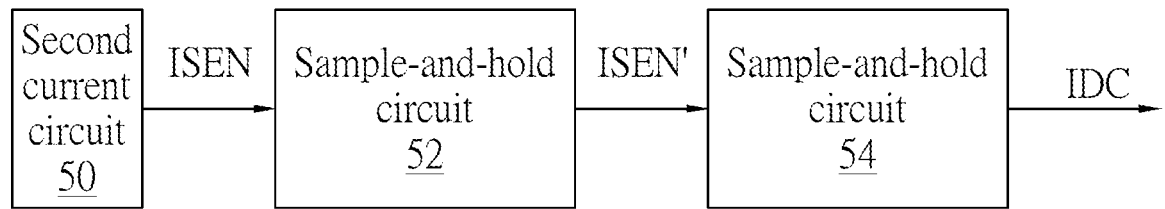
FIG. 6A and FIG. 6B illustrate a schematic diagram and a waveform timing diagram of the better accuracy of the DC component current generated when the emulated current generation circuit samples through two sample-and-hold circuits coupled in series respectively.
Figure 6B:
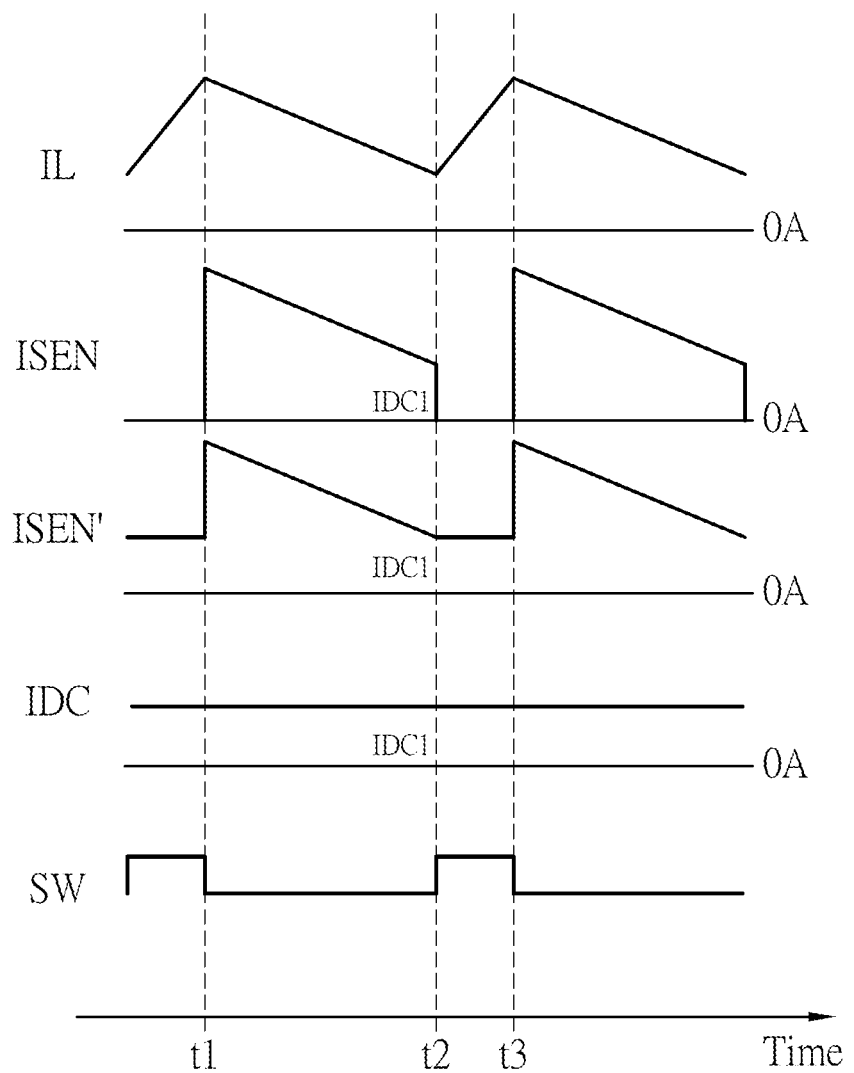

Therefore, in a preferred embodiment, as shown in FIG. 6A and FIG. 6B, the emulated current generation circuit can include two sample-and-hold circuits 52 and 54 coupled in series with each other used for performing the first sample-and-hold on the inductor current IL from the time t1 to the time t2 to generate the sensing current ISEN and performing the first sample-and-hold on the sensing current ISEN from the time t2 to the time t3 to generate the sampled sensing current ISEN', so that the generated DC component current IDC can continuously maintain at the fixed current value IDC1 to effectively improve its accuracy.

In practical applications, the calibration circuit 34 may subtract the emulated sensing current IOUT provided by the combination circuit ADD and the sensing current ISEN provided by the second current circuit 30 to obtain the difference, and after the calibration circuit 34 calculates the difference, the calibration circuit 34 fine-tunes the slope of the ramp signal (that is, the AC component current IRP provided to the combination circuit ADD) according to the calculation result, so as to correct the emulated sensing current IOUT provided by the combination circuit ADD to make it closer to the actual inductance current IL.

Next, two embodiments will be provided for detailed description.

Figure 7A:
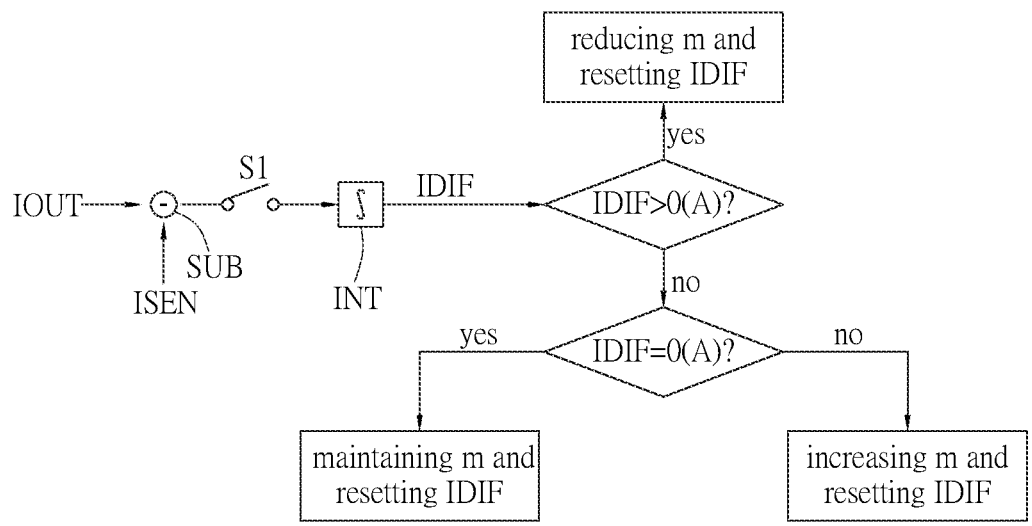
FIG. 7A and FIG. 7B illustrate a calibration process schematic diagram and a waveform timing diagram of the emulated sensing current of the emulated current generation circuit respectively.

First, if the schematic diagram of the emulated sensing current IOUT calibration process shown in FIG. 7A is taken for example, the subtraction circuit SUB subtracts the emulated sensing current IOUT and the sensing current ISEN to obtain the difference, and the noise in the difference is filtered through the switch circuit S1 and then accumulated by the integration circuit INT to obtain the difference signal IDIF. Then, the calibration signal CS is generated according to the current value of the difference signal IDIF to correspondingly adjust the parameters of the first current circuit 36, such as the slope of the AC component current IRP, but not limited to this.

For example, if the current value of the difference signal IDIF is greater than 0 (A), the calibration signal CS will be reduced and the difference signal IDIF will be reset. If the current value of the difference signal IDIF is equal to 0 (A), the calibration signal CS will maintain unchanged and the difference signal IDIF will be reset. If the current value of the difference signal IDIF is less than 0 (A), the calibration signal CS will be increased and the difference signal IDIF will be reset.

Figure 7B:
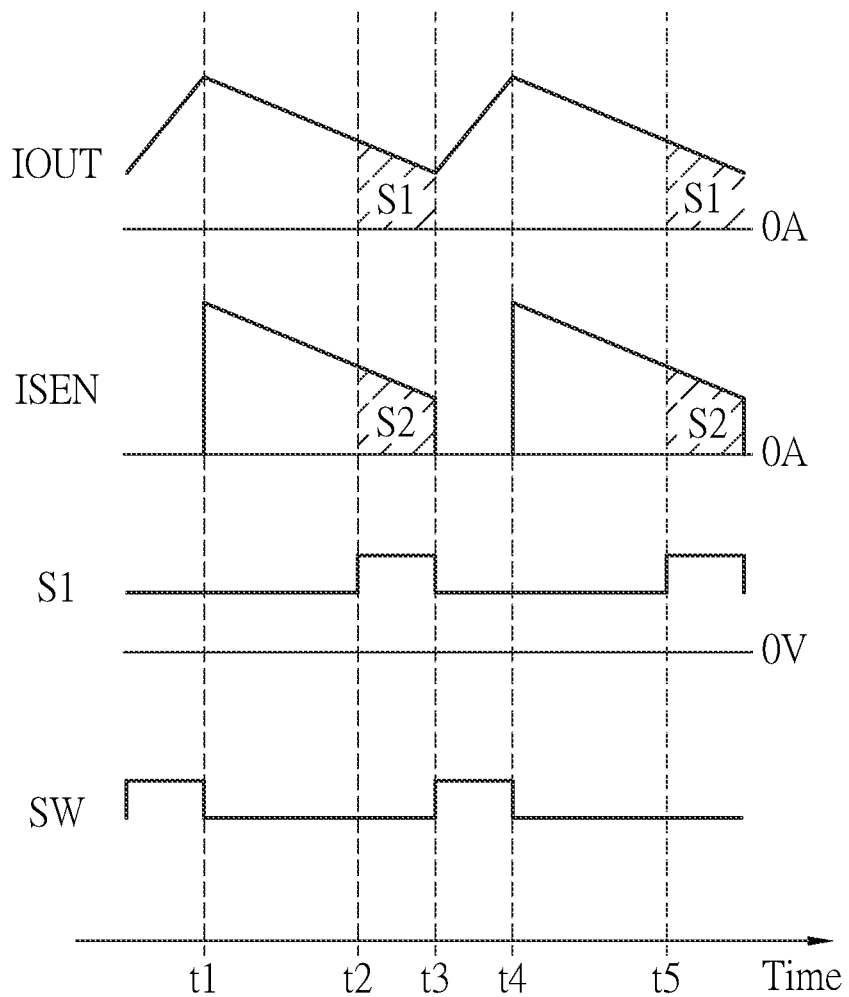

As shown in FIG. 7B, the subtraction circuit SUB subtracts the current area S1 of the emulated sensing current IOUT and the current area S2 of the sensing current ISEN from the time t2 to the time t3 to obtain the difference, and then the difference is accumulated by the integration circuit INT to obtain the difference signal IDIF to generate the calibration signal CS, so that the slope of the AC component current IRP generated by the first current circuit 36 is adjusted accordingly.

It should be noted that when the calibration signal CS is larger, the amplitude of the ramp signal RAMP generated by it will be larger. When the frequency is fixed, the slope of the ramp signal RAMP will be larger, so the slope of the AC component current IRP can be fine-tuned accordingly. Every time the calibration signal CS is updated, the integration circuit INT is reset to re-accumulate. The emulated current generation circuit of the power converting circuit of the invention will continue to repeat the above-mentioned calibration steps, so that the waveform of the emulated sensing current IOUT can approach the actual inductor current IL.

Figure 8A:
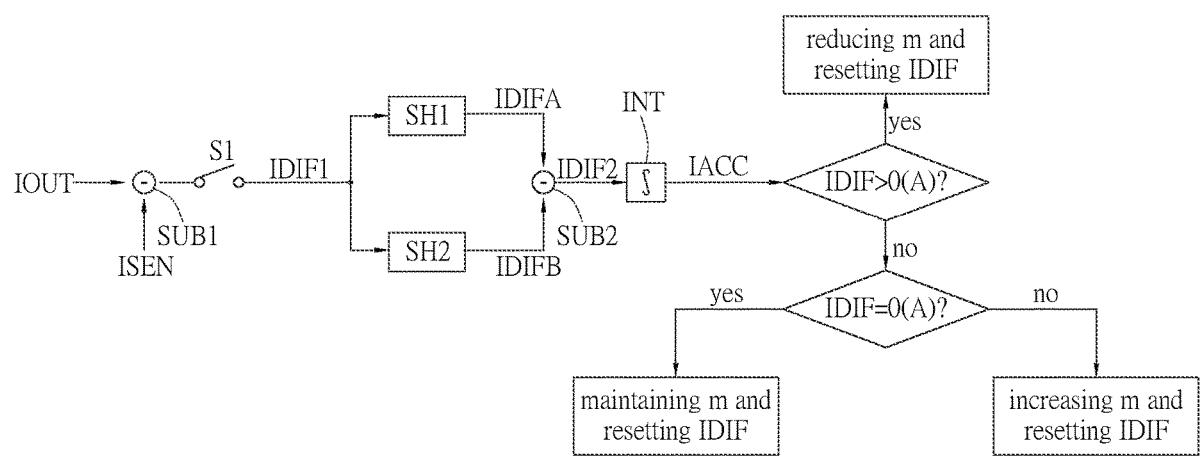
FIG. 8A and FIG. 8B illustrate another calibration process schematic diagram and waveform timing diagram of the emulated sensing current of the emulated current generation circuit respectively.

Next, if the schematic diagram of the emulated sensing current IOUT calibration process shown in FIG. 8A is taken for example, the calibration circuit can include a first subtraction circuit SUB1, a first sampling circuit SH1, a second sampling circuit SH2, a second subtraction circuit SUB2 and an integration circuit INT. The first subtraction circuit SUB1 receives the emulated sensing current IOUT and the sensing current ISEN and subtracts the emulated sensing current IOUT and the sensing current ISEN to obtain a difference signal IDIF1. The first sampling circuit SH1 samples the difference signal IDIF1 at the first time (that is, the time t2 in FIG. 8B) to obtain the first difference IDIFA. The second sampling circuit SH2 samples the difference signal IDIF1 at the second time (that is, the time t3 in FIG. 8B) to obtain the second difference IDIFB. The second subtraction circuit SUB2 receives the first difference IDIFA and the second difference IDIFB and subtracts the first difference IDIFA and the second difference IDIFB to obtain the difference signal IDIF2, which is then accumulated by the integration circuit INT to obtain the accumulated current IACC. Then, the calibration signal CS is generated according to the current value of the accumulated current IACC to correspondingly adjust the parameters of the first current circuit 36, such as the slope of the AC component current IRP, but not limited to this.

For example, if the current value of the accumulated current IACC is greater than 0 (A), the calibration signal CS will be reduced and the accumulated current IACC will be reset. If the current value of the accumulated current IACC is equal to 0 (A), the calibration signal CS will maintain unchanged and the accumulated current IACC will be reset. If the current value of the difference signal IDIF is less than 0 (A), the calibration signal CS is increased and the accumulated current IACC is reset.

Figure 8B:
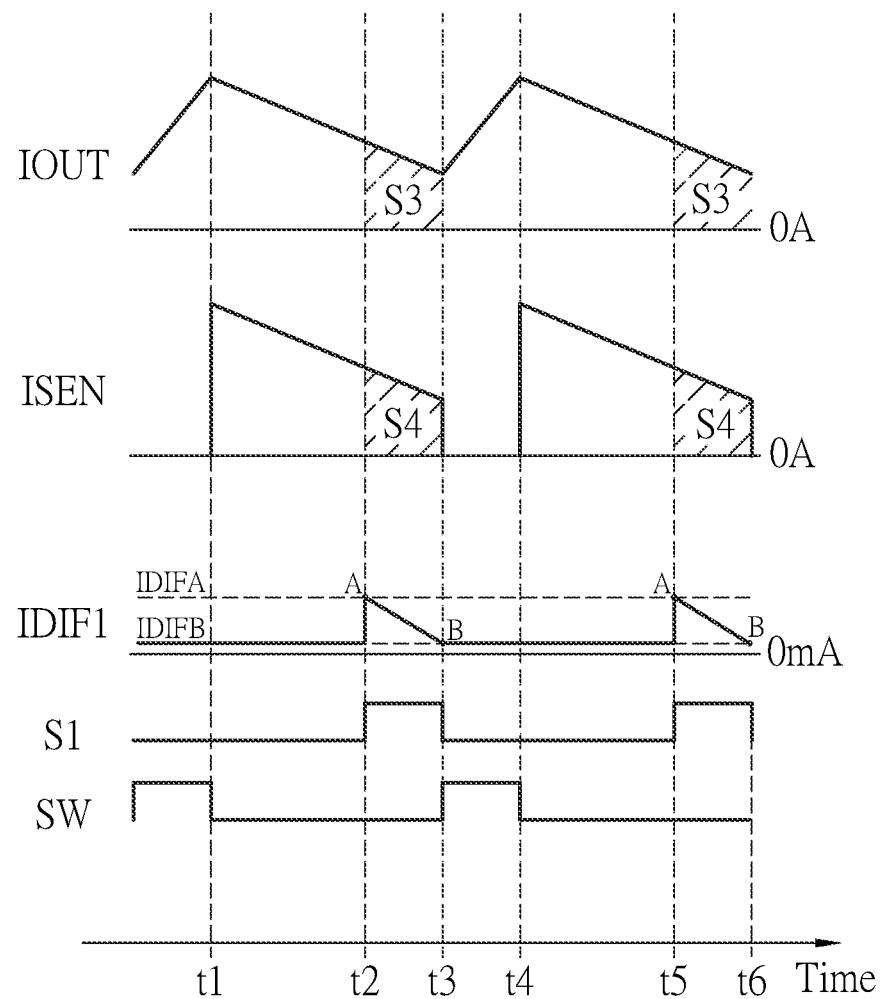

As shown in FIG. 8B, the first subtraction circuit SUB1 subtracts the current area S1 of the emulated sensing current IOUT and the current area S2 of the sensing current ISEN, and then the first sampling circuit SH1 and the second sampling circuit SH2 sample the difference signal IDIF1 at the time t2 and the time t3 to obtain the first difference IDIFA and the second difference IDIFB corresponding to the time t2 and the time t3 respectively. Then, the difference between the first difference IDIFA and the second difference IDIFB is accumulated by the integration circuit INT to obtain the accumulated current IACC, and the calibration signal CS is correspondingly adjusted.

It should be noted that when the calibration signal CS is larger, the amplitude of the ramp signal RAMP generated by the first current circuit 36 will be larger. When the frequency is fixed, the slope of the ramp signal RAMP will be larger, so as to fine-tune the waveform of the AC component current IRP. Every time the calibration signal CS is updated, the integration circuit INT is reset to re-accumulate. The emulated current generation circuit of the power converting circuit of the invention will continue to repeat the above-mentioned calibration steps, so that the waveform of the emulated sensing current IOUT can approach the actual inductor current IL.

Another specific embodiment of the invention is an emulated current generation method. In this embodiment, the emulated current generation method can be applied to a switching power converting circuit (such as a buck power converting circuit or a boost power converting circuit) to provide the emulated sensing current in a fully emulated manner and the emulated sensing current includes an AC component current and a DC component current, but not limited to this.

Figure 9:
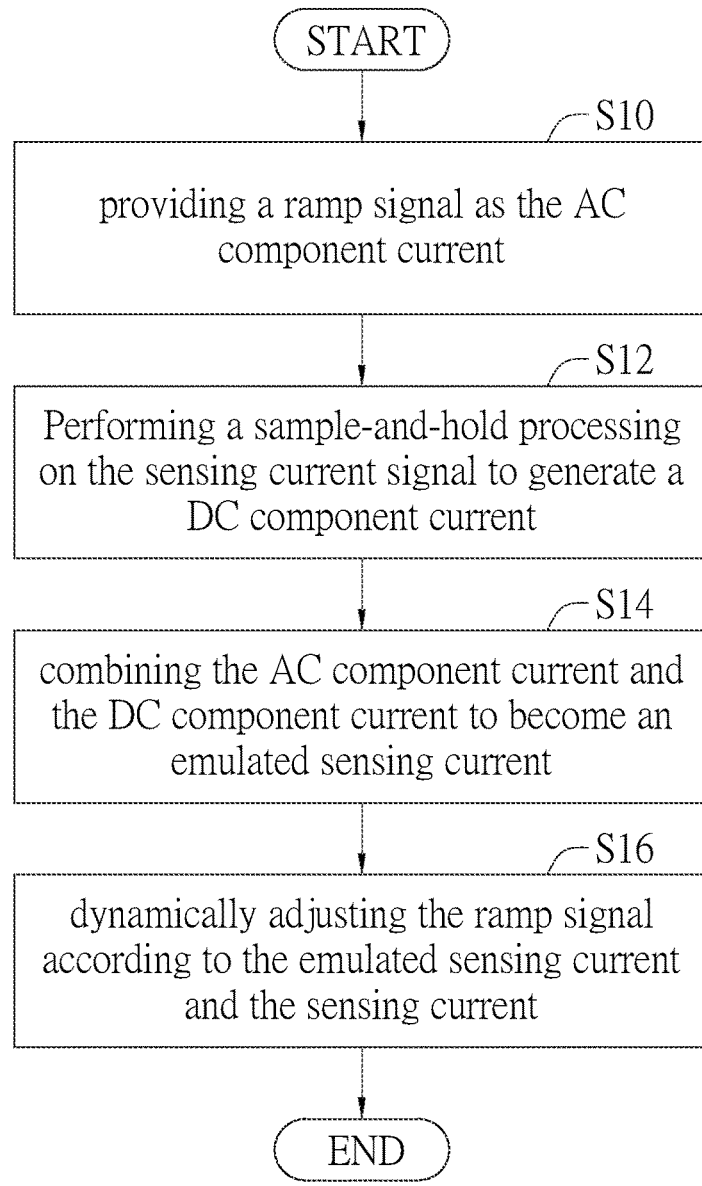
FIG. 9 illustrates a flowchart of the emulated current generation method of the invention.

Please refer to FIG. 9. FIG. 9 illustrates a flowchart of the emulated current generation method in this embodiment. As shown in FIG. 9, the emulated current generation method includes the following steps:

Step S10: Providing a ramp signal as the AC component current;

Step S12: Performing a sample-and-hold processing on the sensing current signal to generate a DC component current;

Step S14: Combining the AC component current and the DC component current to become an emulated sensing current; and Step S16: Dynamically adjusting the ramp signal according to the emulated sensing current and the sensing current.

In practical applications, the step S10 can set the output inductance information through an external setting resistor to generate a ramp signal, but not limited to this; the sensing current signal described in the step S12 is related to the inductor current flowing through the output inductor, but not limited to this; the step S16 is to adjust the slope of the ramp signal, but not limited to this.

In one embodiment, the step S16 further includes integrating the difference between the emulated sensing current and the sensing current to adjust the ramp signal, but not limited to this.

In another embodiment, the step S16 further includes obtaining the difference between the sensing current and the emulated sensing current, and integrating the difference from the first time to the second time to adjust the ramp signal, but not limited to this.

In still another embodiment, the step S12 further includes obtaining the sensing current signal, and performing at least one sample-and-hold processing on the valley value of the sensing current signal at the second time according to the PWM signal to obtain the DC component current, but not limit to this.

Compared to the prior art, the emulated current generation circuit and the emulated current generation method of the power converting circuit of the invention set the AC component current (that is, emulating a waveform of the sensing current), determine the DC component current (that is, emulating a valley value of the sensing current) according to the minimum value of the sensing current, and then combine the two into an emulated sensing current. Since the emulated current generation circuit and the emulated current generation method of the invention predict the change of the actual inductor current through a full emulation method, it can effectively overcome the problems of the prior art incapability of real-time sensing current waveform, high circuit cost and high control difficulty, and the AC component current (that is, emulating a waveform of the sensing current) can be instantly corrected by the calibration circuit to improve the accuracy of the sensing current.

What is claimed is:

1. An emulated current generation circuit of a power converting circuit providing an emulated sensing current comprising an AC component current and a DC component current, the emulated current generation circuit comprising:
a ramp signal generator, coupled to a setting resistor and configured to use the setting resistor to generate a ramp signal as the AC component current;
a current sensing circuit, coupled to an output stage of the power converting circuit and configured to provide a sensing current related to an inductor current flowing through an inductor coupled to the output stage, wherein the DC component current is generated after a sample-and-hold processing is performed on a valley value of the sensing current, and a resistance of the setting resistor is related to an inductance of the inductor;
a combination circuit, coupled to the ramp signal generator and the current sensing circuit respectively and configured to combine the AC component current and the DC component current into the emulated sensing current; and
a calibration circuit, coupled to the ramp signal generator, the current sensing circuit and the combination circuit respectively and configured to dynamically adjust a slope of the ramp signal according to the emulated sensing current and the sensing current,
wherein the emulated sensing current is a full-emulated sensing current generated by predicting a change of the sensing current to emulate a waveform of the sensing current to set the AC component current and to emulate the valley value of the sensing current to determine the DC component current.

2. The emulated current generation circuit of claim 1, wherein the emulated current generation circuit further comprises at least one sample-and-hold circuit coupled between the current sensing circuit and the combination circuit to perform the sample-and-hold processing on the sensing current to generate the DC component current.

3. The emulated current generation circuit of claim 1, wherein the calibration circuit comprises a subtraction circuit configured to receive the emulated sensing current and the sensing current to generate a difference signal, and the calibration circuit generates a calibration signal to the ramp signal generator according to the difference signal.

4. The emulated current generation circuit of claim 1, wherein the calibration circuit includes a first subtraction circuit, a first sampling circuit, a second sampling circuit and a second subtraction circuit, and the first subtraction circuit receives the emulated sensing current and the sensing current, and the first sampling circuit obtains a first difference value at a first time, the second sampling circuit obtains a second difference value at the second time, thereby generating a difference signal, and the calibration circuit generates a calibration signal to the ramp signal generator according to the difference signal.

5. The emulated current generation circuit of claim 4, wherein the calibration circuit further includes an integral circuit and a comparing circuit; the integral circuit is configured to receive the difference signal to generate a difference voltage and the comparing circuit is configured to generate the calibration signal according to the difference voltage.

6. An emulated current generation method providing an emulated sensing current comprising an AC component current and a DC component current, the emulated current generation method comprising:
- (a) generating a ramp signal according to an output inductance information set by an external setting resistor and providing the ramp signal as the AC component current;
- (b) performing a sample-and-hold processing on a valley value of a sensing current related to an inductor current flowing through an inductor to generate the DC component current;
- (c) combining the AC component current and the DC component current into the emulated sensing current; and
- (d) dynamically adjusting a slope of the ramp signal according to the emulated sensing current and the sensing current, wherein the emulated sensing current is a full-emulated sensing current generated by predicting a change of the sensing current to emulate a waveform of the sensing current to set the AC component current and to emulate the valley value of the sensing current to determine the DC component current.

7. The emulated current generation method of claim 6, wherein the step (d) further comprises:
adjusting a slope of the ramp signal.

8. The emulated current generation method of claim 6, wherein the step (d) further comprises:
integrating a difference between the emulated sensing current and the sensing current to adjust the ramp signal.

9. The emulated current generation method of claim 6, wherein the step (d) further comprises:
- (d1) obtaining a difference between the emulated sensing current and the sensing current; and
- (d2) integrating the difference from the first time to the second time to adjust the ramp signal.

10. The emulated current generation method of claim 6, wherein the step (b) comprises:
- (b1) obtaining the sensing current; and
- (b2) performing at least one sample-and-hold processing on the valley value of the sensing current at a second time according to a pulse-width modulation (PWM) signal to obtain the DC component current.

* * * * *